(12) United States Patent
Ben-Haim et al.

(10) Patent No.: US 12,375,048 B2
(45) Date of Patent: Jul. 29, 2025

(54) MULTI-CORE DIGITAL POWER AMPLIFIER WITH UNBALANCED COMBINER

(71) Applicant: Intel Corporation, Santa Clara, CA (US)

(72) Inventors: David Ben-Haim, Shoham (IL); Ofir Degani, Nes-Ammin (IL); Assaf Ben-Bassat, Haifa (IL); Anna Nazimov, Haifa (IL); Naor Shay, Rehovot (IL)

(73) Assignee: Intel Corporation, Santa Clara, CA (US)

( * ) Notice: Subject to any disclaimer, the term of this patent is extended or adjusted under 35 U.S.C. 154(b) by 860 days.

(21) Appl. No.: 17/359,187

(22) Filed: Jun. 25, 2021

(65) Prior Publication Data

US 2022/0416736 A1    Dec. 29, 2022

(51) Int. Cl.
*H03F 3/24* (2006.01)
*H03F 1/42* (2006.01)
*H03F 3/189* (2006.01)
*H03F 3/45* (2006.01)
*H03F 3/60* (2006.01)

(52) U.S. Cl.
CPC ............... *H03F 3/24* (2013.01); *H03F 1/42* (2013.01); *H03F 3/189* (2013.01); *H03F 3/45071* (2013.01); *H03F 3/602* (2013.01); H03F 2200/451 (2013.01); H03F 2200/541 (2013.01)

(58) Field of Classification Search
CPC ...... H03F 3/24; H03F 3/245; H03F 2200/541; H03F 3/602; H03F 3/189; H03F 2200/451; H03F 3/45071; H03F 1/42

USPC ........................................................ 330/295
See application file for complete search history.

(56) References Cited

U.S. PATENT DOCUMENTS

| 6,058,295 | A | 5/2000 | Ikeda et al. |
| 8,472,896 | B2 * | 6/2013 | Xu ............................ H03F 3/24 330/10 |
| 9,106,500 | B2 | 8/2015 | Sorrells et al. |

(Continued)

FOREIGN PATENT DOCUMENTS

| EP | 1470635 B1 | 8/2006 |
| EP | 2215716 B1 | 4/2019 |

OTHER PUBLICATIONS

Li et al., A Wideband Efficiency-Enhanced Class-G Digital Power Amplifier for IoT Applications, Jul. 4, 2018, IEEE Microwave and Wireless Components Letters, vol. 28 (Year: 2018).*

*Primary Examiner* — Andrea Lindgren Baltzell
*Assistant Examiner* — Lance Torbjorn Bartol
(74) *Attorney, Agent, or Firm* — Schwabe, Williamson & Wyatt, P.C.

(57) ABSTRACT

Various embodiments provide systems, devices, and methods for a multi-core digital power amplifier with an unbalanced power combiner. In one example, two or more cores are combined with a transformer section that has a first coupling coefficient and another two or more cores are combined with a second transformer section that has a second coupling coefficient that is different than the first coupling coefficient. The outputs of different cores may be cross-coupled with the primary inductors of the transformers. The digital power amplifier may provide an output power that is flat over a relatively wide operating range. Other embodiments may be described and claimed.

19 Claims, 4 Drawing Sheets

(56) References Cited

U.S. PATENT DOCUMENTS

| | | |
|---|---|---|
| 9,257,939 B1 | 2/2016 | Zhang et al. |
| 9,306,502 B2 * | 4/2016 | Chan ................... H03F 1/0277 |
| 9,344,138 B2 * | 5/2016 | Guimaraes ............. H03F 3/602 |
| 9,444,417 B2 | 9/2016 | Maxim et al. |
| 10,263,649 B2 * | 4/2019 | Wang ..................... H03F 1/565 |
| 2016/0065129 A1 | 3/2016 | Zhang et al. |
| 2020/0127620 A1 | 4/2020 | Shao et al. |

\* cited by examiner

MULTI-CORE DIGITAL POWER AMPLIFIER WITH UNBALANCED COMBINER

FIELD

Embodiments of the present invention relate generally to the technical field of electronic circuits, and more particularly to digital power amplifiers and associated devices, systems, and methods.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

Designing a digital power amplifier (DPA) that covers a wide bandwidth (e.g., more than 30%) of Wi-Fi high band (HB)+ultra high band (UHB), 5.18 GHz to 7.12 GHz, is challenging. One technique is to use low K transformer-based combiners. With low K combiners, less power is coupled to the output, so a wider bandwidth comes at the expense of output power. Another technique is to use multi-stage structures. However, multi-stage structures suffer from poorer efficiency.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
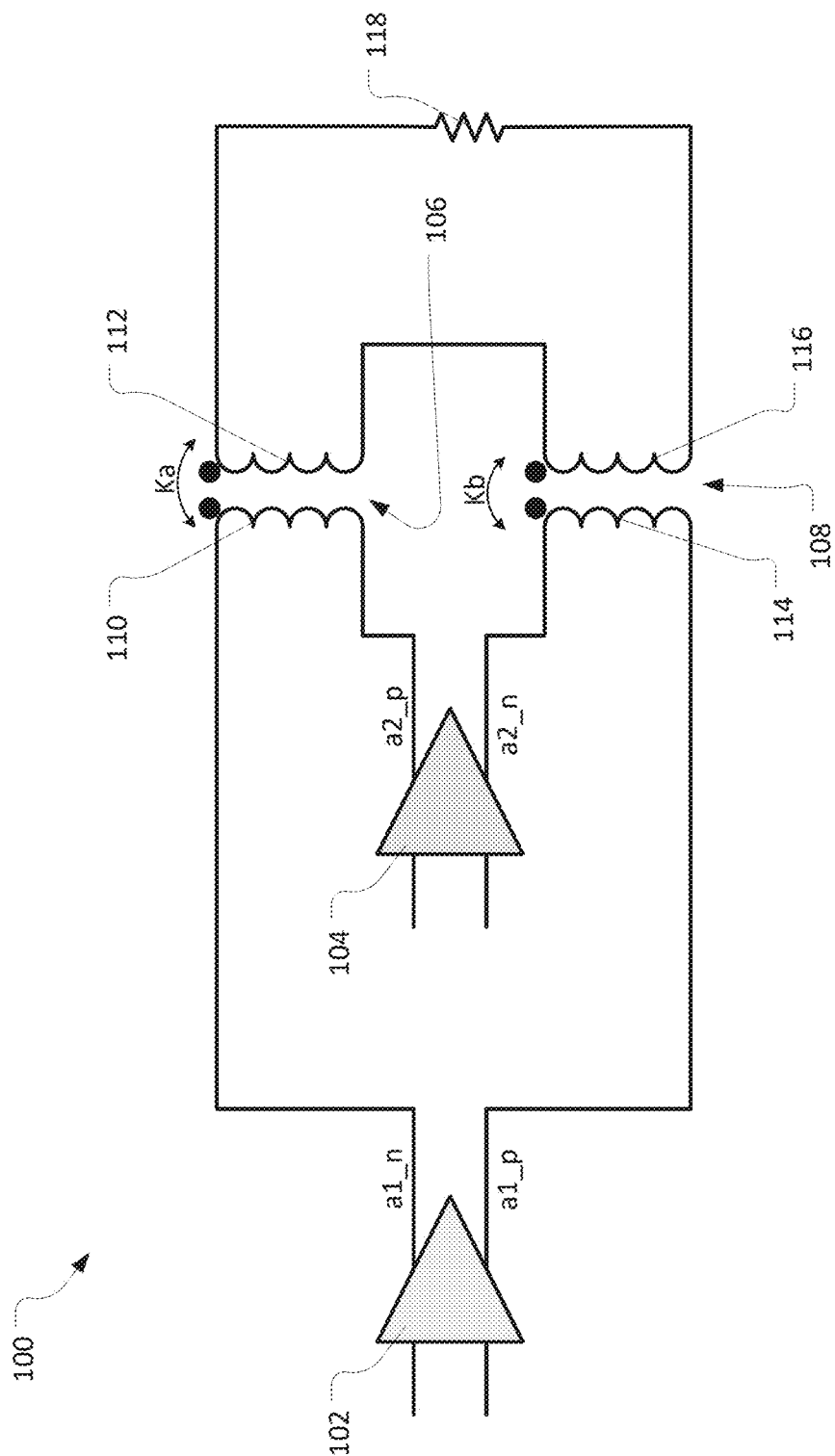
FIG. 1 schematically illustrates a digital power amplifier with two cores, in accordance with various embodiments.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Various embodiments herein provide an unbalanced combiner for a multi-core digital power amplifier (DPA). In some embodiments, two or more cores are combined with a transformer section that has a first coupling coefficient and another two or more cores are combined with a second transformer section that has a second coupling coefficient that is different than the first coupling coefficient. In some embodiments, the cores may be cross-coupled, with a primary inductor of a first transformer coupled in series between a first output (e.g., a positive output) of a first core and a second output (e.g., negative output) of a second core. A primary inductor of a second transformer may be coupled in series between a second output (e.g., a negative output) of the first core and a first output (e.g., a positive output) of the second core.

The total power at the output may be the sum of the outputs from the first and second transformer sections. The unbalanced combiner described herein may provide a wider bandwidth with a flatter frequency response than prior techniques. Additionally, the unbalanced combiner may provide higher power and efficiency due to lower penalty of the combiner insertion loss. Furthermore, the flattened response may reduce dispersion for wide bandwidth channels. In some embodiments, the "flat response" may correspond to a frequency response of within 2 dB over an operating frequency range.

FIG. 1 illustrates an example digital power amplifier (DPA) 100 in accordance with various embodiments. The DPA 100 may be a "high voltage" DPA that operates using the battery supply voltage (e.g., 3-3.6 V or another suitable voltage). The DPA 100 may operate in wireless local area network (WLAN) HB/UHB frequency range (e.g., 5.18 GHz to 7.12 GHZ).

The DPA 100 may include a first amplifier core 102 and a second amplifier core 104. In some embodiments, the amplifier cores 102 and 104 may receive a same input signal (e.g., a differential signal). The first amplifier core 102 may have a positive output a1_p and a negative output a1_n, while the second amplifier core 104 may have a positive output a2_p and a negative output a2_n. The DPA 100 may further include a first transformer 106 and a second transformer 108. The first transformer 106 may include a primary inductor 110 and a secondary inductor 112, and the second transformer 108 may include a primary inductor 114 and a secondary inductor 116.

In various embodiments, the primary inductor 110 of the first transformer 106 may be coupled in series between the negative output a1_n of the first amplifier core 102 and the positive output a2_p of the second amplifier core 104. The primary inductor 114 of the second transformer 108 may be coupled in series between the positive output a1_p of the first amplifier core 102 and the negative output a2_n of the second amplifier core 104.

The secondary inductors 112 and 116 may be coupled to an output load 118 to provide an amplified radio frequency (RF) output signal to the output load 118 (e.g., for transmission by one or more antennas). In some embodiments, first terminals of the secondary inductors 112 and 116 may be coupled to the output load 118 and second terminals of the secondary inductors 112 and 116 may be coupled to one another. The first amplifier core 102 and second amplifier core 104 may be separately controllable (e.g., turned on and off) by a control circuit for power control.

In various embodiments, the coupling coefficient Ka of the first transformer 106 may be different than the coupling coefficient Kb of the second transformer 108. This can be accomplished by having the inductors that form the two transformers be different sizes. The different coupling coefficients may enable the DPA 100 to provide a maximum power response that is substantially flat (e.g., within 2 dB) across an operating frequency range of the DPA 100.

Figure 2:
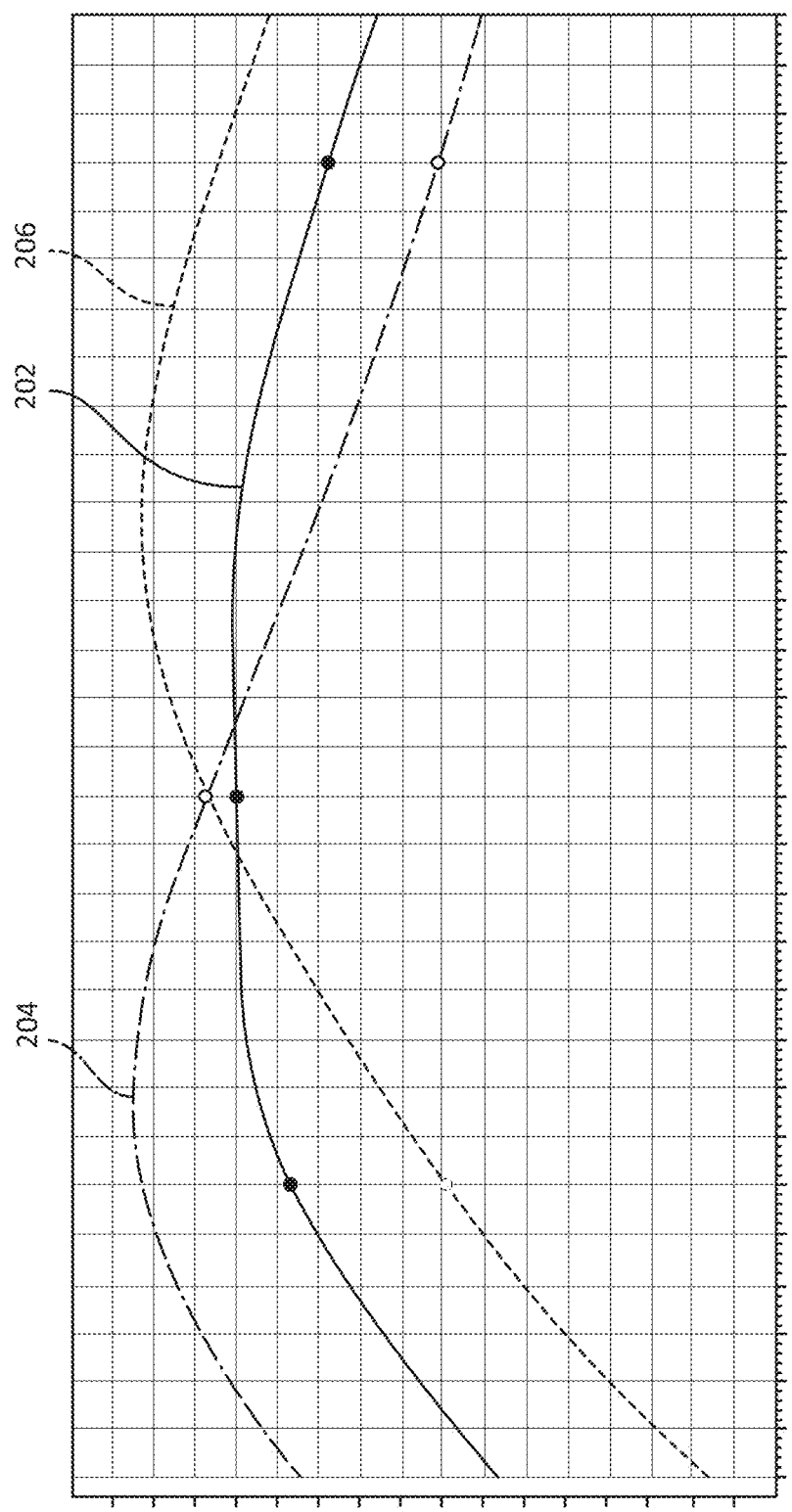
FIG. 2 illustrates plots of output power versus frequency for models of an unbalanced combiner, a balanced combiner with a relatively low resonant frequency, and a balanced combiner with a relatively high resonant frequency, in accordance with various embodiments.

For example, FIG. 2 illustrates a plot 202 of output power versus frequency for a model of an unbalanced combiner as described herein, compared with corresponding plots 204 and 206 for a balanced combiner with a low resonant frequency and a balanced combiner with a high resonant frequency, respectively. As shown, the unbalanced combiner provides a flatter and wider frequency response.

The DPA circuits described herein (e.g., DPA 100 and/or DPA 300 which is discussed further below) are distinguished from analog power amplifiers, which have different operation and design requirements. Some analog power amplifiers may be designed to have relatively flat gain over a specific frequency range. Accordingly, some analog power amplifiers may perform signal processing at the pre-driver stage to adjust different branches of the analog signal. However, DPAs do not have gain like analog power amplifiers. The techniques described herein may include an unbalanced combiner circuit at the output stage of the DPA to provide the maximum output power that is relatively flat (e.g., within 2 dB) over an operating frequency range.

Figure 3:
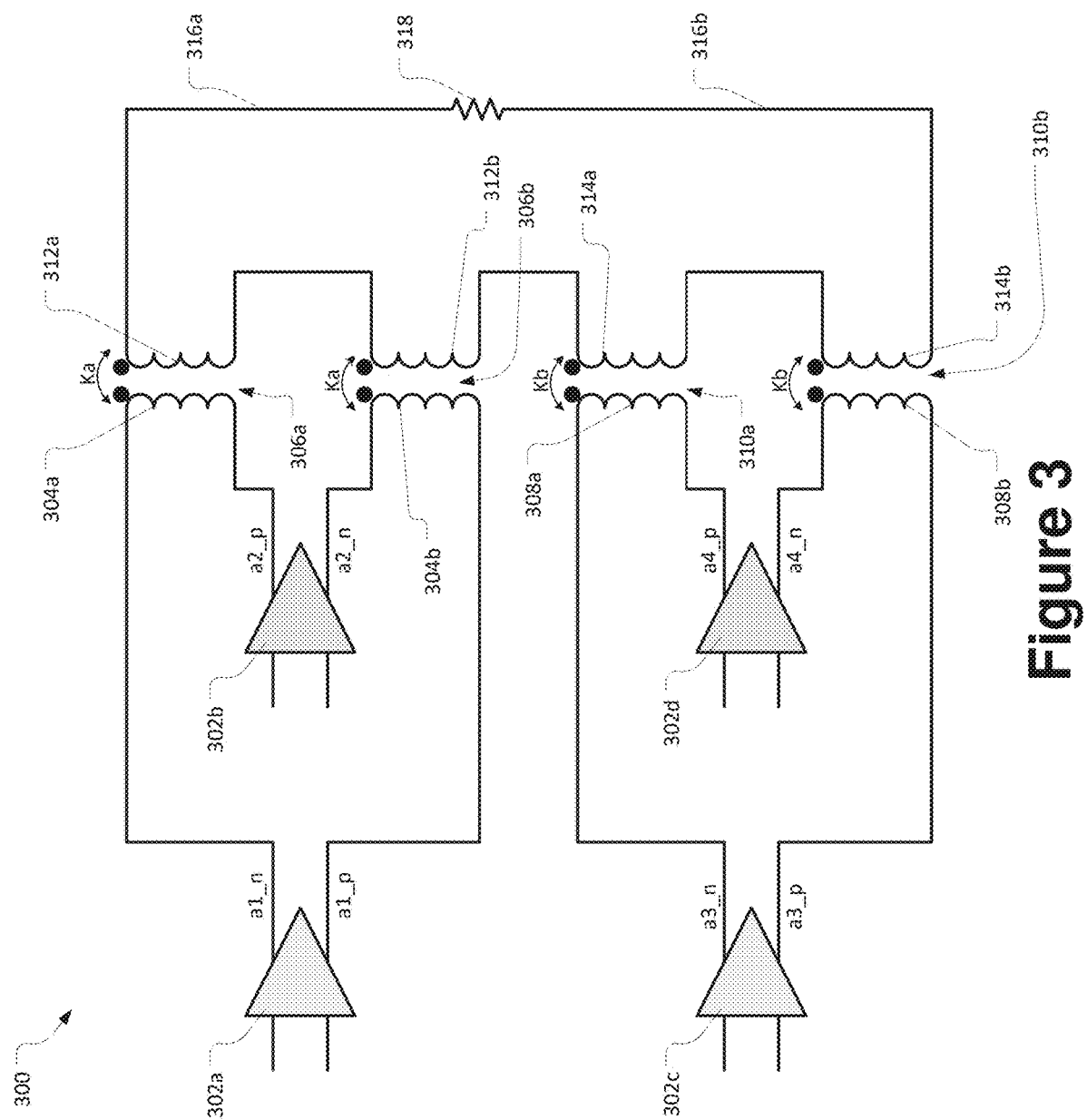
FIG. 3 schematically illustrates digital power amplifier with four cores, in accordance with various embodiments.

FIG. 3 illustrates another example DPA 300 in accordance with various embodiments. The DPA 300 may include four amplifier cores 402a-d. Amplifier core 302a may have a positive output a1_p and a negative output a1 n. Amplifier core 302b may have a positive output a2_p and a negative output a2 n. Amplifier core 302c may have a positive output a3_p and a negative output a3_n. Amplifier core 302d may have a positive output a4_p and a negative output a4 n. The amplifier cores 302a-b may be cross coupled with primary inductors 304a-b of transformers 306a-b, and the amplifier cores 302c-d may be cross-coupled with primary inductors 308a-b of transformers 310a-b. The transformers 306a-b may have a coupling coefficient Ka and the transformers 310a-b may have a coupling coefficient Kb that is different than Ka.

The secondary inductors 312a-b and 314a-b of the transformers 306a-b and 310a-b may be coupled in series with one another between output terminals 316a-b. The output terminals 316a-b may be coupled to an output load 318.

In some embodiments, the DPA 300 may use a lower supply voltage than the DPA 100 for a comparable output. The tuning of the transformers 306a-b and 310a-b may be selected to provide a flat frequency response without any dips over an operating frequency range. Additionally, a power back-off scheme may be used in which the power adjustments (e.g., going from full cores to partial cores or lower power) are performed symmetrically using both sections at all power levels. This enables good output voltage and phase linearity when sweeping the input codes.

Figure 4:
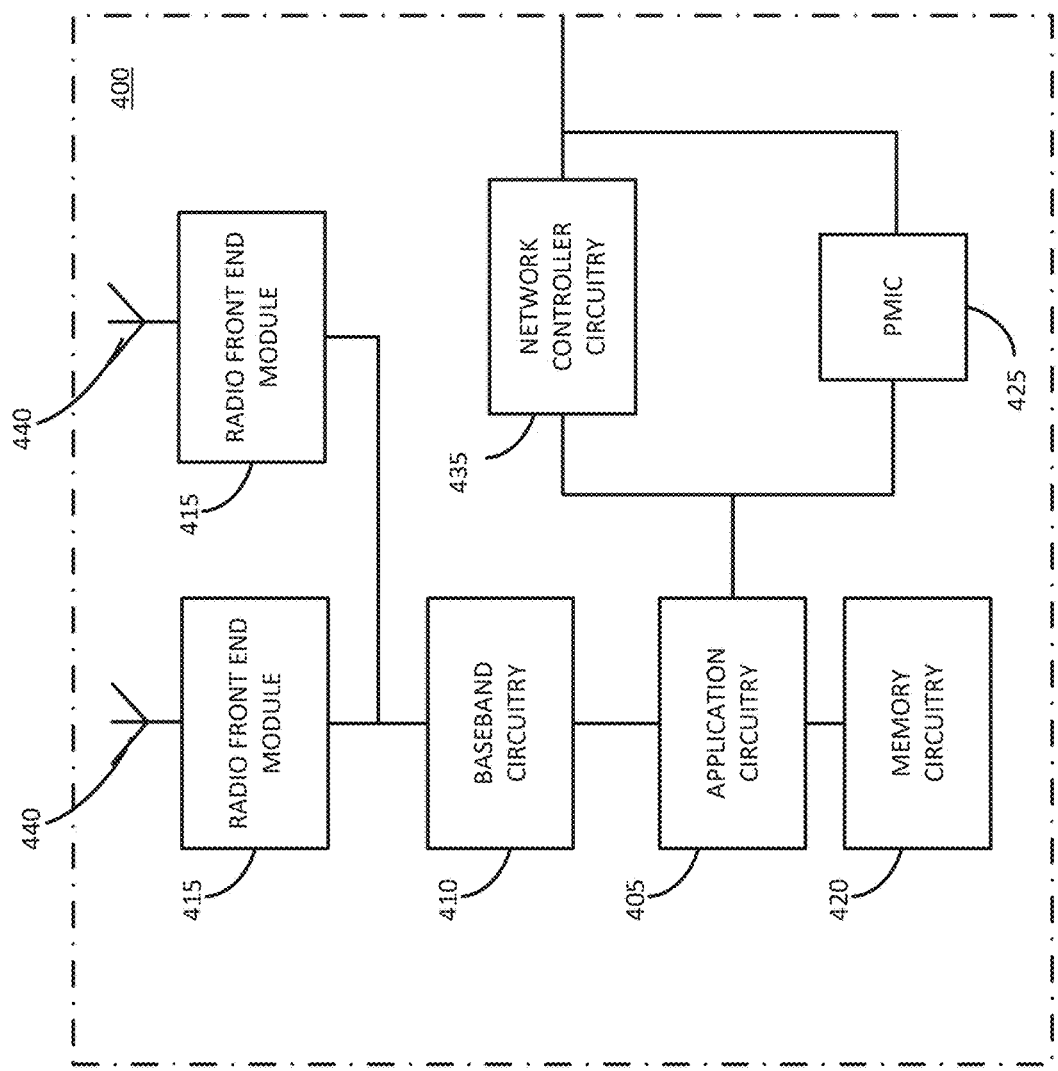
FIG. 4 illustrates an example of a computer platform in accordance with various embodiments.

FIG. 4 illustrates an example of a computing system 400 ("system 400") in accordance with various embodiments. The system 400 may include one or more of application circuitry 405, baseband circuitry 410, one or more radio front end modules 415615, memory circuitry 420, power management integrated circuitry (PMIC) 425625, and network controller circuitry 435.

The terms "application circuitry" and/or "baseband circuitry" may be considered synonymous to, and may be referred to as, "processor circuitry." As used herein, the term "processor circuitry" may refer to, is part of, or includes circuitry capable of sequentially and automatically carrying out a sequence of arithmetic or logical operations, or recording, storing, and/or transferring digital data. The term "processor circuitry" may refer to one or more application processors, one or more baseband processors, a physical central processing unit (CPU), a single-core processor, a dual-core processor, a triple-core processor, a quad-core processor, and/or any other device capable of executing or otherwise operating computer-executable instructions, such as program code, software modules, and/or functional processes.

Application circuitry 405 may include one or more central processing unit (CPU) cores and one or more of cache memory, low drop-out voltage regulators (LDOs), interrupt controllers, serial interfaces such as SPI, 12C or universal programmable serial interface module, real time clock (RTC), timer-counters including interval and watchdog timers, general purpose input/output (I/O or IO), memory card controllers such as Secure Digital (SD) MultiMediaCard (MMC) or similar, Universal Serial Bus (USB) interfaces, Mobile Industry Processor Interface (MIPI) interfaces and Joint Test Access Group (JTAG) test access ports. As examples, the application circuitry 405 may include one or more Intel Pentium®, Core®, or Xeon® processor(s); Advanced Micro Devices (AMD) Ryzen® processor(s), Accelerated Processing Units (APUs), or Epyc® processors; and/or the like. In some embodiments, the system 400 may not utilize application circuitry 405, and instead may include a special-purpose processor/controller to process IP data received from an EPC or 7GC, for example.

Additionally or alternatively, application circuitry 405 may include circuitry such as, but not limited to, one or more field-programmable devices (FPDs) such as field-programmable gate arrays (FPGAs) and the like; programmable logic devices (PLDs) such as complex PLDs (CPLDs), high-capacity PLDs (HCPLDs), and the like; ASICs such as structured ASICs and the like; programmable SoCs (PSoCs); and the like. In such embodiments, the circuitry of application circuitry 405 may comprise logic blocks or logic fabric, and other interconnected resources that may be programmed to perform various functions, such as the procedures, methods, functions, etc. of the various embodiments discussed herein. In such embodiments, the circuitry of application circuitry 405 may include memory cells (e.g., erasable programmable read-only memory (EPROM), electrically erasable programmable read-only memory (EEPROM), flash memory, static memory (e.g., static random access memory (SRAM), anti-fuses, etc.)) used to store logic blocks, logic fabric, data, etc. in look-up-tables (LUTs) and the like.

The baseband circuitry 410 may be implemented, for example, as a solder-down substrate including one or more integrated circuits, a single packaged integrated circuit soldered to a main circuit board or a multi-chip module containing two or more integrated circuits. Although not shown, baseband circuitry 410 may comprise one or more digital baseband systems, which may be coupled via an interconnect subsystem to a CPU subsystem, an audio subsystem, and an interface subsystem. The digital baseband subsystems may also be coupled to a digital baseband interface and a mixed-signal baseband subsystem via another interconnect subsystem. Each of the interconnect subsystems may include a bus system, point-to-point connections, network-on-chip (NOC) structures, and/or some other suitable bus or interconnect technology, such as those discussed herein. The audio subsystem may include digital signal processing circuitry, buffer memory, program memory, speech processing accelerator circuitry, data converter circuitry such as analog-to-digital and digital-to-analog converter circuitry, analog circuitry including one or more of amplifiers and filters, and/or other like components. In an aspect of the present disclosure, baseband circuitry 410 may include protocol processing circuitry with one or more instances of control circuitry (not shown) to provide control functions for the digital baseband circuitry and/or radio frequency circuitry (e.g., the radio front end modules 415).

The radio front end modules (RFEM) 415 may include radio frequency integrated circuits (RFICs), amplifiers (for example, power amplifiers and/or low-noise amplifiers), and/or other components to effectuate over-the-air transmissions. The RFEM 415 may include beamforming circuitry to increase transmission/reception directivity. The RFEM 415 may send and/or receive signals via one or more antennas 440. In some embodiments, the RFEM 415 may include one or more DPAs with an unbalanced combiner as described herein, such as the DPA 100.

The memory circuitry 420 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magnetoresistive random access memory (MRAM), etc., and may incorporate the three-dimensional (3D) cross-point (XPOINT) memories from Intel® and Micron®. Memory circuitry 420 may be implemented as one or more of solder down packaged integrated circuits, socketed memory modules and plug-in memory cards.

The PMIC 425 may include voltage regulators, surge protectors, power alarm detection circuitry, and one or more backup power sources such as a battery or capacitor. The power alarm detection circuitry may detect one or more of brown out (under-voltage) and surge (over-voltage) conditions.

The network controller circuitry 435 may provide connectivity to a network using a standard network interface protocol such as Ethernet, Ethernet over GRE Tunnels, Ethernet over Multiprotocol Label Switching (MPLS), or some other suitable protocol. Network connectivity may be provided to/from the system 400 using a physical connection, which may be electrical (commonly referred to as a "copper interconnect"), optical, or wireless. The network controller circuitry 435 may include one or more dedicated processors and/or FPGAs to communicate using one or more of the aforementioned protocols. In some implementations, the network controller circuitry 435 may include multiple controllers to provide connectivity to other networks using the same or different protocols.

The components shown by FIG. 4 may communicate with one another using interface circuitry. As used herein, the term "interface circuitry" may refer to, is part of, or includes circuitry providing for the exchange of information between two or more components or devices. The term "interface circuitry" may refer to one or more hardware interfaces, for example, buses, input/output (I/O) interfaces, peripheral component interfaces, network interface cards, and/or the like. Any suitable bus technology may be used in various implementations, which may include any number of technologies, including industry standard architecture (ISA), extended ISA (EISA), peripheral component interconnect (PCI), peripheral component interconnect extended (PCIx), PCI express (PCIe), or any number of other technologies. The bus may be a proprietary bus, for example, used in a SoC based system. Other bus systems may be included, such as an I2C interface, an SPI interface, point to point interfaces, and a power bus, among others.

EXAMPLES

Some non-limiting examples of various embodiments are provided below.

Example 1 is digital power amplifier comprising: a first amplifier core with a first positive output coupled to a first terminal of a first inductor and a first negative output coupled to a first terminal of a second inductor; a second amplifier core with a second positive output coupled to a second terminal of the second inductor and a second negative output coupled to a second terminal of the first inductor; a third inductor magnetically coupled with the first inductor to form a first transformer; and a fourth inductor magnetically coupled with the second inductor to form a second transformer with the second inductor, wherein the third and fourth inductors are to be coupled in series with an output load to provide an amplified radio frequency (RF) output signal across the output load, and wherein the first and second transformers have different coupling coefficients.

Example 2 is the digital power amplifier of Example 1, wherein first terminals of the respective third and fourth inductors are to be coupled to the output load, and wherein second terminals of the respective third and fourth inductors are coupled to one another.

Example 3 is the digital power amplifier of Example 1, wherein the first and second amplifier cores receive a same input signal.

Example 4 is the digital power amplifier of Example 1, wherein the digital power amplifier is to generate the amplified RF output signal across the output load for transmission by one or more antennas.

Example 5 is the digital power amplifier of Example 1, wherein the digital power amplifier has a maximum power response within 2 decibels across an operating frequency range of the digital power amplifier.

Example 6 is the digital power amplifier of Example 5, wherein the operating frequency range includes 5.18 GHz to 7.12 GHz.

Example 7 is the digital power amplifier of Example 1, wherein the first and second amplifier cores are to receive an operating voltage of 3 to 3.6 Volts.

Example 8 is the digital power amplifier of Example 1, wherein the first and second amplifier cores are turned on and off separately.

Example 9 is a digital radio frequency (RF) power amplifier comprising: a first pair of amplifier cores cross-coupled in series with a primary stage of a first pair of transformers, wherein the first pair of transformers have a first coupling coefficient; a second pair of amplifier cores cross-coupled in series with a primary stage of a second pair of transformers, wherein the second pair of transformers have a second coupling coefficient that is different than the first coupling coefficient; and an output load coupled across a secondary stage of the first and second pairs of transformers.

Example 10 is the digital RF power amplifier of Example 9, wherein secondary stage inductors of the first and second pair of transformers are coupled in series with one another.

Example 11 is the digital RF power amplifier of Example 9, wherein the first pair of amplifier cores cross-coupled in series with the primary stage of the first pair of transformers includes: a first amplifier core with a first positive output coupled to a first terminal of a first inductor and a first negative output coupled to a first terminal of a second inductor; and a second amplifier core with a second positive output coupled to a second terminal of the second inductor and a second negative output coupled to a second terminal of the first inductor.

Example 12 is the digital RF power amplifier of Example 9, wherein the first and second pairs of amplifier cores are to receive a same input signal.

Example 13 is the digital RF power amplifier of Example 9, wherein the digital power amplifier has a maximum power response within 2 decibels across an operating frequency range of the digital power amplifier.

Example 14 is the digital RF power amplifier of Example 13, wherein the operating frequency range includes 5.18 GHz to 7.12 GHz.

Example 15 is a computer system comprising: a processor to generate a baseband signal; a radio frequency (RF) circuit to generate a RF signal based on the baseband signal; and a digital RF power amplifier to amplify the RF signal and provide the amplified RF signal to a pair of output terminals for transmission over a wireless communication network. The digital RF power amplifier includes: a first amplifier core with a first positive output and a first negative output; a second amplifier core with a second positive output and a second negative output; a first transformer that includes a first primary stage and a first secondary stage, wherein the first primary stage is coupled in series between the first positive output and the second negative output; and a second transformer that includes a second primary stage and a second secondary stage, wherein the second primary stage is coupled in series between the first negative output and the first positive output, wherein the first and second transformers have different coupling coefficients; wherein the first and second secondary stages are coupled in series between the pair of output terminals.

Example 16 is the computer system of Example 15, wherein the first and second amplifier cores receive a same input signal that corresponds to the RF signal generated by the RF circuit.

Example 17 is the computer system of Example 15, wherein the digital RF power amplifier has a maximum power response within 2 decibels across an operating frequency range of the digital RF power amplifier.

Example 18 is the computer system of Example 17, wherein the operating frequency range includes 5.18 GHz to 7.12 GHz.

Example 19 is the computer system of Example 15, wherein the first and second amplifier cores are turned on and off separately.

Example 20 is the computer system of Example 15, wherein the wireless communication network is a Wi-Fi network.

Example 21 is the computer system of Example 15, further comprising one or more antennas coupled to the output terminals to transmit the amplified RF signal.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

What is claimed is:

1. A digital power amplifier comprising:
    a first differential amplifier core with a first positive output coupled to a first terminal of a first inductor and a first negative output coupled to a first terminal of a second inductor;
    a second differential amplifier core with a second positive output coupled to a second terminal of the second inductor and a second negative output coupled to a second terminal of the first inductor;
    a third inductor magnetically coupled with the first inductor to form a first transformer; and
    a fourth inductor magnetically coupled with the second inductor to form a second transformer with the second inductor, wherein first terminals of the respective third and fourth inductors are to be coupled to an output load to provide an amplified radio frequency (RF) output signal across the output load, wherein second terminals of the respective third and fourth inductors are coupled to one another, and wherein the first and second transformers have different coupling coefficients selected to provide a substantially flat frequency response across an operating frequency range.

2. The digital power amplifier of claim 1, wherein the first and second differential amplifier cores receive a same input signal.

3. The digital power amplifier of claim 1, wherein the digital power amplifier is to generate the amplified RF output signal across the output load for transmission by one or more antennas.

4. The digital power amplifier of claim 1, wherein the digital power amplifier has a maximum power response within 2 decibels across an operating frequency range of the digital power amplifier.

5. The digital power amplifier of claim 4, wherein the operating frequency range includes 5.18 GHz to 7.12 GHz.

6. The digital power amplifier of claim 1, wherein the first and second differential amplifier cores are to receive an operating voltage of 3 to 3.6 Volts.

7. The digital power amplifier of claim 1, wherein the first and second differential amplifier cores are turned on and off separately.

8. A digital radio frequency (RF) power amplifier comprising:
a first pair of differential amplifier cores cross-coupled in series with a primary stage of a first pair of transformers, wherein the first pair of transformers has a first coupling coefficient;
a second pair of differential amplifier cores cross-coupled in series with a primary stage of a second pair of transformers, wherein the second pair of transformers has a second coupling coefficient that is different from the first coupling coefficient, wherein the different coupling coefficients are selected to provide a substantially flat frequency response across an operating frequency range; and
an output load coupled across a secondary stage of the first and second pairs of transformers, wherein secondary stage inductors of the first and second pair of transformers are coupled in series.

9. The digital RF power amplifier of claim 8, wherein the first pair of differential amplifier cores cross-coupled in series with the primary stage of the first pair of transformers includes:
a first amplifier core with a first positive output coupled to a first terminal of a first inductor and a first negative output coupled to a first terminal of a second inductor; and
a second amplifier core with a second positive output coupled to a second terminal of the second inductor and a second negative output coupled to a second terminal of the first inductor.

10. The digital RF power amplifier of claim 8, wherein the first and second pairs of differential amplifier cores are to receive a same input signal.

11. The digital RF power amplifier of claim 8, wherein the digital power amplifier has a maximum power response within 2 decibels across an operating frequency range of the digital power amplifier.

12. The digital RF power amplifier of claim 11, wherein the operating frequency range includes 5.18 GHz to 7.12 GHz.

13. A computer system comprising:
a processor to generate a baseband signal;
a radio frequency (RF) circuit to generate an RF signal based on the baseband signal; and
a digital RF power amplifier to amplify the RF signal and provide the amplified RF signal to a pair of output terminals for transmission over a wireless communication network, wherein the digital RF power amplifier includes:
a first differential amplifier core with a first positive output and a first negative output;
a second differential amplifier core with a second positive output and a second negative output;
a first transformer that includes a first primary stage and a first secondary stage, wherein the first primary stage is coupled in series between the first positive output and the second negative output; and
a second transformer that includes a second primary stage and a second secondary stage, wherein the second primary stage is coupled in series between the first negative output and the first positive output, wherein the first and second transformers have different coupling coefficients selected to provide a substantially flat frequency response across an operating frequency range;
wherein the first and second secondary stages are coupled in series between the pair of output terminals.

14. The computer system of claim 13, wherein the first and second differential amplifier cores receive a same input signal that corresponds to the RF signal generated by the RF circuit.

15. The computer system of claim 13, wherein the digital RF power amplifier has a maximum power response within 2 decibels across an operating frequency range of the digital RF power amplifier.

16. The computer system of claim 15, wherein the operating frequency range includes 5.18 GHz to 7.12 GHz.

17. The computer system of claim 13, wherein the first and second differential amplifier cores are turned on and off separately.

18. The computer system of claim 13, wherein the wireless communication network is a Wi-Fi network.

19. The computer system of claim 13, further comprising one or more antennas coupled to the output terminals to transmit the amplified RF signal.

* * * * *